(12) United States Patent
Ohta et al.

(10) Patent No.: US 6,821,655 B1
(45) Date of Patent: Nov. 23, 2004

(54) LOW-RESISTANCE ITO THIN FILM AND METHOD FOR MANUFACTURING SUCH A FILM

(75) Inventors: Hiromichi Ohta, Tokyo (JP); Masahiro Orita, Tokyo (JP)

(73) Assignee: Hoya Corporation, Tokyo (JP)

(*) Notice: Subject to any disclaimer, the term of this patent is extended or adjusted under 35 U.S.C. 154(b) by 0 days.

(21) Appl. No.: 09/615,883

(22) Filed: Jul. 14, 2000

(30) Foreign Application Priority Data

Jul. 16, 1999 (JP) .................................. 11-203976
Jun. 22, 2000 (JP) ................................ 2000-187755

(51) Int. Cl.$^7$ .............................................. B32B 19/00

(52) U.S. Cl. ...................... 428/701; 428/689; 428/702

(58) Field of Search ........................ 428/689, 697, 428/699, 701, 702

(56) References Cited

U.S. PATENT DOCUMENTS 5,539,546 A * 7/1996 Koden et al.
5,955,213 A * 9/1999 Yano et al.
6,437,363 B1 * 8/2002 Kadota et al.

OTHER PUBLICATIONS

Kwok et al, Pulsed laser deposited crystalline ultrathin ITO films and their conducting mechanisms, Thin Solid Films, Nov. 1998.*

Jie et al. Experimental Studies of the Effect of Plasma Wavelength on Radiative Poperties of Indium Tin Oxides heat Mirror Films for Solar Thermal Applications. Fourteenth symposium on Thermophysical Properties. Jun. 2000.*

S. Ishibasdhi, Y. Higuchi, Y. Ota & K. Nakamura, "Low Resistivity Indium–Tin Oxide Transparent Conductive Films. II. Effect of Sputtering Voltage on Electrical Property of Films", American Vacuum Society, May/Jun. 1990, pp. 1403–1406, vol. 8, No. 3, Japan.

Yuzo Shigesato, Satoru Takaki & Takeshi Haranoh, "Electrical and Structural Properties of Low Resistivity TinDoped Indium Oxide Films", American Institute of Physics, Apr. 1992, pp. 3356–3363, Japan.

Eiji Minami et al., Extended Abstracts (The 46$^{th}$ Spring Meeting, 1999).

Y. Shigesato, "Technology for Transparent Conductive Film", p. 112, Ohmsha.

Prem Nath, R.F. Bunshah, B.M. Bason and O.M. Staffsud, "Electrical and Optical Properties of In$_2$O$_3$: Sn Films Prepared by Activated Reactive Evaporation", *Thin Solid Films*, 72 (1980), pp. 463–468.

(List continued on next page.)

* cited by examiner

*Primary Examiner*—Jennifer McNeil
(74) *Attorney, Agent, or Firm*—Woodard, Emhardt, Moriarty, McNett & Henry LLP

(57) ABSTRACT

A low-resistance ITO thin film having a resistivity on the order of, or lower than 10$^{-4}$ Ωcm, and a method for manufacturing such a film are disclosed. The ITO thin film is manufactured by depositing ITO on a crystalline substrate by pulsed laser deposition, low-voltage sputtering, oxygen cluster beam deposition, chemical vapor deposition, metal organic chemical vapor deposition, metal organic chemical vapor deposition—atomic layer deposition, or molecule beam epitaxy.

13 Claims, 1 Drawing Sheet

OTHER PUBLICATIONS

Swati Ray, Ratnabali Banerjee, N. Basu, A.K. Batabyal, and A.K. Barua, "Properties of Tin Doped Indium Oxide Thin Films Prepared by Magnetron Sputtering", American Institute of Physics, 1983, pp. 3497–3501.

I.A. Rauf, "A Novel Method for Preparing Thin Films with Selective Doping in a Single Evaporation Step," Journal of Materials Science Letters 12 (1993), pp. 1902–1905.

I.A. Rauf, "Structure and Properties of Tin–Doped Indium Oxide Thin Films Prepared by Reactive Electron–Beam Evaporation with a Zone–Confining Arrangement," American Institute of Physics, 1996, pp. 4057–4065.

"Preparation of $In_2O_3$ and Tin–Doped $In_2O_3$ Films by a Novel Activated Reactive Evaporation Technique", Nath et al., *Thin Solid Films,* 69 (1980) 63–68.

LOW-RESISTANCE ITO THIN FILM AND METHOD FOR MANUFACTURING SUCH A FILM

BACKGROUND OF THE INVENTION

1. Field of the Invention

The present invention relates to a low-resistance ITO thin film and a method for manufacturing such a thin film, and more particularly, to a low-resistance ITO thin film and method for manufacturing such a film used for a transparent electrode in a solar battery, display device such as liquid crystal display (LCD) and the like.

2. Description of the Related Art

As a transparent electrode material, ITO (Indium Tin Oxide), FTO (Fluorine doped Tin Oxide) and AZO (Aluminum doped Zinc Oxide) have been used. Among these materials, ITO has been mainly used in a liquid crystal display, and FTO has been mainly used in a solar battery.

As liquid crystal displays become larger and finer, i.e., higher resolution, there is a demand to reduce the electrical resistance of ITO. For example, in a STN (Super Twisted Nematic) liquid crystal display, the transparent electrode works, i.e., functions as a signal electrode, and has a strip shape. As the display device increases in size, the strip becomes longer and as the display device becomes finer, i.e., increased resolution, the strip becomes thinner. As a result, the electrical resistance along the length of the strip from one end to the other increases, which drops or decreases the electrical voltage therebetween and makes it difficult for proper switching of the liquid crystal molecules.

In a TFT (Thin Film Transistor) liquid crystal display, the signal electrode has been ordinarily made of metallic material. However, in order to simplify the production steps and reduce production cost by simplification of the device structure, the transparent electrode has been used as the signal electrode. In this display also, as the display device increases in size and resolution, the electrical resistance from one end to the other of the strip electrode increases. For the above reason, the transparent electrode is currently used as a signal electrode only in a display having a diagonal size of 11 inches.

In a solar battery, it is important to improve the efficiency-of the battery. Factors that contribute to the efficiency include (1) confining the light energy emitted in a photoelectric material, (2) improvement of collecting effective photoelectric carriers and contribution to the photovoltaic effect thereof, (3) reduced loss due to the recombined photoelectric carriers, (4) reduced loss of series resistance, (5) reduced loss of voltage factor and (6) collecting a wider range spectrum of light energy. The electrical resistance of the transparent electrode is a series resistance loss, which influences a conversion efficiency particularly in a large size element. For the above reason, the reduced resistance of the transparent electrode is also required in a solar battery.

With recent rapid developments of the liquid crystal displays, there have been some experiments to reduce the electrical resistance of ITO. For example, Ishibashi et al. succeeded in manufacturing ITO film having a resistivity of $1.5 \times 10^{-4}$ $\Omega$cm on a substrate having a temperature of 200° C. by reducing plasma impedance to form a thin film with low sputtering voltage using a DC sputtering method (S. Ishibashi, Y. Higuchi, Y. Ota, and K. Nakamura, J. VaC. Sci. Technol. A8(1990)1403). Also, it is reported that when the plasma impedance is reduced by increasing the magnetic field intensity from 140G to 480G, the sputtering voltage can be reduced from 540V to 330V with a constant discharge current, which makes it possible to reduce the resistance of the electrode (Y. Shigesato, S. Takaki, and T. Haranoh, J. Appl. Phys., 71(7)(1992)3356). When the sputtering is conducted at a high voltage, the thin film is grown with high-energy particle irradiation so that a high degree of uniform strain and compression pressure are introduced into the thin film. On the contrary, when the sputtering is conducted with a low voltage, the number of high-energy particles is reduced. As a result, the crystallization of the ITO is improved and thereby increases carrier density by reducing damage to the crystal structure which traps the donor and decreases density of neutral scattering center to improve the mobility thereof, which enables a reduction of the resistance of the film (Y. Shigesato, "Technology for Transparent Conductive Film", P112, Ohmusha, 1999).

Yamada et al. developed a vapor deposition device using a high current oxygen cluster ion beam and succeeded in manufacturing an ITO thin film having a resistivity of $8.4 \times 10^{-5}$ $\Omega$cm by using the above device. Though production of a film having a resistivity lower than $1 \times 10^{-5}$ $\Omega$cm has been previously reported a number of times so far, this report is the first repeatable process for manufacturing such a film. In the above vapor deposition method, oxygen is introduced to the growing thin film by irradiating oxygen cluster ions to produce a thin film oxide. In this technology, for example, the oxygen cluster ions having an average cluster size of 1000 is accelerated at 10 keV and then irradiated to the substrate. Since the kinetic energy of each oxygen molecule is as low as 10 eV, a high quality ITO film with low resistance is obtained without damage to the crystal structure.

Japanese Laid-Open Patent Application No. 7-262829 discloses a method for manufacturing a thin film by using xenon (Xe) or krypton (Kr) gas instead of argon (Ar) gas in a direct-current sputtering, high-frequency sputtering or ion beam sputtering method to obtain an ITO thin film having a resistivity lower than $1 \times 10^{-4}$ $\Omega$cm.

The low-voltage sputtering method has an advantage in that CI damage to the thin film can be reduced since the number of high-energy particles is reduced. However, since the high-energy particles cannot be completely removed in the process, C) a film having a resistivity lower than $1 \times 10^{-4}$ $\Omega$cm cannot be produced.

The high-current cluster ion beam vapor deposition method has an advantage in that a film having a resistivity lower than $1 \times 10^{-4}$ $\Omega$cm can be produced without damage to the crystal structure since the kinetic energy of each oxygen particle is low. However, by this method, a large-scale film production cannot be practically realized.

In the method disclosed in Japanese Laid-Open Patent Application No. 7-262829, since the sputtering method is utilized, it has a disadvantage in that it is not clean and the targets are attached to a wall of the chamber which will cause dust. Also, since the oxygen pressure cannot be set high, composition-controlling characteristics are limited. Further, since the process cannot be conducted in a high vacuum atmosphere, a condition requiring a low level or substantially zero level of oxygen cannot be effectively realized. Moreover, since the thickness of the thin film cannot be controlled, production of a thin film in an atomic layer growth mode cannot be carried out.

It is therefore an object of the present invention to By provide a low-resistance thin film having a resistivity on the order of, or lower than $10^{-4}$ $\Omega$cm, and a method for manufacturing such a film.

SUMMARY OF THE INVENTION

In order to solve the above-mentioned problem, there is provided a method for manufacturing a low-resistance ITO film comprising a step of depositing an ITO film on a crystalline substrate by a pulsed laser vapor deposition method at a temperature of 500–1000° C.

According to the above invention, a low-resistance ITO thin film having a resistivity lower than $1 \times 10^{-4}$ Ωcm is provided. The pulsed laser vapor deposition method has advantages in that it is clean, oxygen pressure can be set high and the thickness of the film can be properly controlled. Therefore, by using the method, a low-resistance ITO thin film excellent in resistance, mobility, and carrier density, having an improved crystal structure and uniform thickness can be provided. In the above method, the thin film may be manufactured on a large scale by rotating the substrate, arranging a plurality of laser beam or the like.

Also, there is provided a method for manufacturing a low-resistance ITO film comprising a step of depositing an ITO film on a crystalline substrate by one of low-voltage sputtering, oxygen cluster beam deposition, chemical vapor deposition, metal organic chemical vapor deposition, metal organic chemical vapor deposition—atomic layer deposition, and molecule beam epitaxy.

According to the above invention, a low-resistance ITO thin film having a resistivity lower than $1 \times 10^{-4}$ Ωcm is provided. The method has an advantage in that ITO thin film can be produced in a large scale at lower cost.

DESCRIPTION OF THE PREFERRED EMBODIMENT

Figure 1:
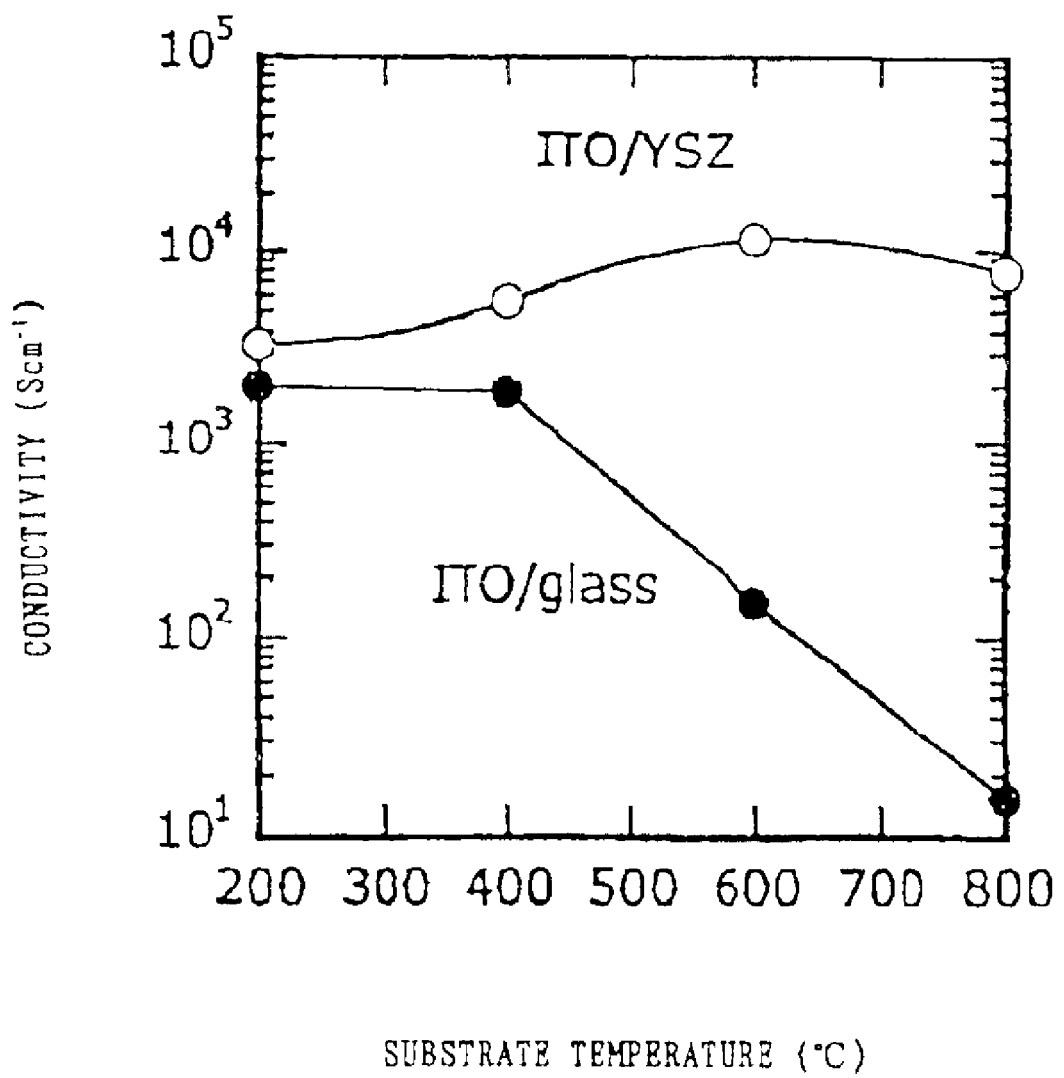
FIG. 1 is a graph showing a relationship between a temperature of the substrate and a conductivity ($Scm^{-1}$) of the ITO film according to an example of the present invention.

The preferred embodiments of the present invention will now be described in further detail.

In the present invention, a low-resistance ITO thin film is defined as a low-resistance ITO thin film having an electrical resistivity on the order of or lower than $1 \times 10^{-4}$ Ωcm. An ITO is a solid solution of indium oxide ($In_2O_3$) to which $SnO_2$ is added and, What is, tin doped indium oxide, which is generally referred to as ITO, i.e., indium tin oxide. $In_2O_3$ has a C rare earth type crystal structure in which Sn is solved in In site as a solid solution.

In the present invention, $SnO_2$ content in the ITO thin film is generally 5–20 wt %, preferably 6–15 wt %. Expressing it in by mol %, $SnO_2$ content in the ITO thin film is generally 2.8–10.5 mol %, preferably 4–8 mol %. When the $SnO_2$ content is greater than 20 wt % or 10.5 mol %, a low resistance cannot be realized due to the deposited $SnO_2$ phase. When the $SnO_2$ content is lower than 5 wt % or 2.8 mol %, a low resistance cannot be realized due to the small amount of Sn ions in the solid solution.

The low-resistance ITO thin film may have a corundum type crystal structure. The corundum type crystal structure is a high-pressure phase of $In_2O_3$, which can possibly be produced by selecting a proper method. In the corundum type $In_2O_3$ crystal, a distance between In ions is shorter than that in C rare earth metal $In_2O_3$ crystal, which can provide a high degree of mobility. Therefore, when Sn ions are solid-dissolved in the corundum type $In_2O_3$ crystal in the same amount as in C rare earth metal $In_2O_3$ crystal, a lower resistance can be realized compared to the C rare earth metal $In_2O_3$ crystal. In this specification, $In_2O_3$ crystal means a C rare earth metal $In_2O_3$ crystal, as otherwise provided.

A substrate on which the low-resistance ITO thin film is produced is a crystalline substrate. The crystalline substrate has a crystalline orientation of atoms or ions on its surface. Examples of such a crystalline substrate include YSZ (Yttrium Stabilized Zirconia) single crystal substrate, but do not include a glass substrate whose surface is in a vitreous state and is not crystallized. However, a glass substrate having a c-axis oriented ZnO thin film on its surface, which has a crystal orientation of atoms or ions, can be a crystalline substrate of the present invention. SiC single crystal substrate or silicon single crystal substrate is also a crystalline substrate.

The crystal orientation of a surface of the crystalline substrate preferably has a crystal suitability for $In_2O_3$ single crystal structure. For example, since both YSZ and $In_2O_3$ has a cubic structure and a lattice constant of YSZ is twice as long as that of $In_2O_3$, they are suitable. When YSZ single crystal is used for the substrate, a heteroepitaxially grown $In_2O_3$ layer can be obtained. The $In_2O_3$ layer has a high degree of crystallization and has a low resistance. As a substrate on which a corundum type ITO thin film is produced, substrates suitable for a corundum type crystal structure, such as sapphire substrate, are preferably used.

Stability ratios of the lattice constant between the crystalline substrate and ITO ($In_2O_3$), which is expressed as a minimum difference between the integer multiple of each lattice constant (calculated from a common multiple) are as follows. In case of ITO (100), YSZ (100) 1.8% (1 ITO lattice:2 YSZ lattices), Si (100) 0.2% (23 ITO lattices:25 Si lattices), 3C-SiC(100) 1.0% (41 ITO lattices: 50 3C-SiC lattices), $CaF_2$(100) 0.0% (27 ITO lattices:25 $CaF_2$ lattices), MgO (100) 3.8% (20 ITO lattice:25 MgO lattices). In case of ITO (111), 6H-SiC (0001) 0.6%(43 ITO lattices:50 6H-SiC lattices), ZnO (0001) 1.3%(23 ITO lattices:25 ZnO lattices).

Since oxide has a small covalent bonding but mainly has ionic bonding, the bonding direction is not restricted. Therefore, the suitability of the lattice constant is wider, compared to a compound semiconductor. This means that though each lattice is not suitable, a plurality of lattices are suitable.

As the crystalline substrate, the single crystal substrate having a good crystallization and symmetry and suitability to $In_2O_3$, which is suitable for heteroepitaxial growth, is preferably used. A surface of the single crystal substrate is preferably super-flattened on an atomic order by a high temperature heat-treatment or etching process before the thin film is produced thereon. For example, the YSZ single crystal substrate can be super-flattened by heat-treatment in the range of 1200–1500° C., preferably 1300–1400° C. When the temperature is lower than 1200° C., the super-flattening is difficult due to a low vapor pressure of YSZ. When the temperature is higher than 1500° C., projections are created due to the high vapor pressure of YSZ. The preferable temperature range is 1300–1400° C.

The flatness of the YSZ single crystal substrate super-flattened to an atomic order, expressed by average surface roughness Ra, Ra is smaller than 10 Å when scanned in 1 in square by an interatomic microscope.

A face orientation of YSG single crystal may be the (100) face, (111) face or other faces as long as it is suitable for symmetry and lattice constant to $In_2O_3$. When the (111) face is selected, $In_2O_3$ crystal elements constitutes conical structures in which (111) bearing faces to a normal of the substrate and (100) face is exposed outside, and is accurately aligned. This structure can be observed with an interatomic microscope or scanning electron microscope. The symmetry of the crystal face is an important factor. Since the ITO (100) face is 4 times symmetry, the substrate crystal face for ITO (100) must be 4 times symmetry. Since the ITO (111) face is 3 times symmetry, the substrate crystal face for ITO (111) must be 3 times symmetry.

When a glass substrate having a c-axis oriented ZnO film is used as a crystalline substrate, an oriented film is oriented to the $In_2O_3(111)$ bearing. The c-axis orientated of ZnO film can be produced by a pulsed laser vapor deposition method, sputtering method, chemical vapor deposition method, and is also commercially available.

In the first embodiment of the present invention, the low-resistance ITO thin film is manufactured by a pulsed laser deposition (PLD) method. The PLD method is a physical film production method in which a laser beam is used as a vaporization source. In the PLD method, a high-power pulsed laser beam is focused and irradiated to a surface of a target to heat the surface of the target to a temperature greater than 2000° C. instantly by light-solid interaction. By utilizing an instant abrasion of the element of the surface of the target, abraded atoms, molecules, ions and clusters, which are group of several to several hundreds of atoms or molecules loosely configured, are deposited on the substrate. During the process, since a plasma light pole (ploom) is observed, the process involves not only a thermal process but also a photoionic process. The PLD method, compared to the other film production methods such as the sputtering method and the vapor deposition method, has advantages in that it is clean, the oxygen pressure can be set in a wider range and the thickness of the film can be easily controlled.

As a target of the PLD method, sinter or compacted powder of hyperpure In metal or hyperpure ITO or hyperpure In-Sn alloy is used. Though the compacted metal target can be easily prepared, It has a disadvantage in that a vacuum chamber is stained with powder.

When the target is a metal, though hyperpure material can be obtained, It has a disadvantage in that vaporization does not occur since metal reflects the laser beam. With developments of elaboration of sinter, a sinter having a relative density greater than 99% and a purity of approximately 99.9% is commercially available. This has an advantage in that it does not stain the vacuum chamber and does not reflect the laser beam.

The content of $SnO_2$ in the target is generally 5–20 wt %, preferably 6–15 wt %. When the $SnO_2$ content is greater than 20 wt %, $SnO_2$ layer is deposited, which prohibits the low resistance of the thin film. When the $SnO_2$ content is smaller than 5 wt %, content of Sn ions is too small to realize the low resistance of the thin film.

The degree of vacuum in the vacuum chamber before thin film production is preferably at least $1\times10^{-7}$ Torr. When the degree of vacuum is lower than that, the main content of the gas in the chamber is $H_2O$, which is attached to the surface of the target and substrate to deteriorate the characteristics of the $In_2O_3$ thin film. If possible, a super-vacuum chamber which can provide a vacuum of $1\times10^{-7}$–$1\times10^{-10}$ Torr is preferred. As a discharge pump, a molecule turbo pump or sorption pump is proper to flow oxidation gas such as $O_2$ during thin film production. In the vacuum chamber, the target and substrate are placed to face each other. The degree of vacuum during film production is preferably $1\times10^{-3}$–$1\times10^{-7}$ Torr, which is wide $O_2$ pressure range.

A distance between the target and the substrate is generally several centimeters to 10 centimeters. The target is preferably rotated to avoid the formation of recesses in the target by the Irradiation of the laser beam. The explosive evaporation from the target surface by the laser irradiation involves a luminescence having a balloon shape called ploom. The ploom has a diameter of several centimeters to 10 centimeters, in which the material is deposited. When uniform film production in a wide range is intended, the rotation of the substrate is preferred.

The laser beam is focused on the target surface to be introduced thereto. A power density of the laser beam is determined by an area of the focal point and energy of the laser beam. When the power density is too low, the explosive evaporation does not occur and the production of the thin film cannot be performed. When the laser power is too high, a rate of film production is too high, which prohibits the production of high quality thin films. Therefore, the focal point area and energy of the laser beam must be adjusted to obtain the proper power density.

Specifically, the laser power density is preferably 0.1–100 $J/cm^2$. When the density is lower than 0.1 $J/cm^2$, power density is too small to form the ploom and to deposit the material to the substrate. When the density is higher than 100 $J/cm^2$, the density is too high and the target material is excessively scattered, which prohibits proper forming of film. For example, when the thin film having a thickness of approximately 200 nm in a 100 mm square substrate, the power density of the beam is preferably 1–10 $J/cm^2$. When the film is formed in a larger area, or when the laser beam is scanned in the target, the laser beam having a power density greater than 1–10 $J/cm^2$ can be used. A pulse frequency of the laser beam, which depends on a pulsed laser vapor deposition device, is preferably several Hz to several hundreds Hz.

As a laser beam, one having an ultraviolet band is generally selected. A beam having a visible region cannot be absorbed in the target and does not generate the explosive evaporation.

As a ultraviolet laser, an excimer laser of XeCl, KrF, ArF or the like or 4 multiple wave of Nd:YAG laser may be utilized. When the laser device which emits a continuous light like a Nd:YAG laser is used as a laser source, the continuous light can be irradiated to the target. However, when the light is oscillated to the pulse by a mode lock system or Q switch system, a threshold of the energy increases and the explosive evaporation can be induced more effectively.

A temperature of the substrate is set in a range of 200–1000° C., and a partial pressure of oxygen is set in a range of 0–1 kPa. At a temperature lower than 200° C., crystallization of the indium oxide does not proceed and at a temperature higher than 1000° C., vaporization of the indium oxide proceeds to deteriorate the thin film. In the above temperature range, when the substrate temperature increases, the crystallization of the indium oxide improves and the particles thereof increases in size. The shape of the particle is spherical in the temperature range of 200–500° C., however, when the temperature is set higher than 500° C., the shape gradually changes to cubic reflecting the crystal structure of indium oxide. For the foregoing reason, the substrate temperature is 500–1000° C. In the above range, 500–900° C. is preferred, 530–720° C. is more preferred, and 600° C. is most preferred, as shown in the following EXAMPLE 1.

The partial pressure of oxygen in the pulsed laser deposition is preferably $1\times10^{-5}$–100 Pa. At a pressure lower than $1 \times 10^{-5}$ Pa, oxygen content in the film is too small and In metal is deposited. At a pressure higher than 100 Pa, partial pressure of oxygen is too high, and ploom generated during irradiation of laser beam to the target is small, which reduces the deposition rate. Also, the partial pressure of oxygen influences the carrier density via an amount of oxygen demand, the partial pressure of oxygen must be selected so as to minimize the resistance of the thin film. The optimal value of the partial pressure of oxygen, which depends on the vapor deposition device and the deposition temperature, is generally $1 \times 10^{-3}$–1 Pa.

The thickness of the low-resistance ITO film can be controlled by the energy density and the irradiation pulse number of the laser beam irradiated to the target. When the thin film is used for the transparent electrode in the liquid crystal display, the thickness is controlled in the range of 100–500 nm.

When the deposition rate sufficiently decreases by controlling the energy density of the laser beam and the distance between the target, the atomic layer growth mode can be realized, in which indium oxide is deposited lattice by lattice to form one terrace and then deposited lattice by lattice. Whether the atomic layer growth mode is realized can be judged by an observation of a surface morphology of the growing thin film by an interatomic microscope or monitoring diffraction intensity by high-speed electron beam. In the atomic layer growth mode, since the thin film is grown in one lattice unit, a thin film having an improved crystallization and accurately uniform thickness (i.e. variation of thickness is lower than 10% in a 10 nm thick film) can be realized in the entire substrate. Thus, the atomic layer growth mode is effective in improving crystallization of the ITO thin film and reducing the resistance of the film.

In the second embodiment of the present invention, the ITO thin film having a resistively lower than $1 \times 10^{-4}$ Ωcm can be manufactured on the above-mentioned crystalline substrate by selecting a proper thin film production method. The present inventors have found that when a film production method, such as a low-voltage sputtering method or vapor deposition method using oxygen cluster beam, is carried out on the crystalline substrate instead of an ordinary glass substrate to improve the crystallization of the ITO thin film, a thin film having a low resistance can be produced.

The method for manufacturing such a highly-crystallized ITO thin film includes chemical vapor deposition, metal organic chemical vapor deposition, metal organic chemical vapor deposition—atomic layer deposition and molecule beam epitaxy. By one of the above methods, a low-resistance ITO thin film having a resistivity lower than $1 \times 10^{-4}$ Ωcm can be obtained.

The $SnO_2$ content, crystal structure, crystalline substrate of the low-resistance ITO thin film is the same as those previously described. The condition for manufacturing the thin film is adjusted depending on the method for manufacturing. In the second embodiment also, the ITO film is preferably formed by heteroepitaxial growth or atomic growth mode lattice by lattice.

In the above method, the substrate temperature actually measured is preferably 500–1000° C., more preferably 500–800° C. At a substrate temperature higher than 500° C., the crystallization of the ITO thin film is improved, and Sn ions as a dopant are efficiently solved in the $In_2O_3$ as a solid-solution. At a temperature lower than 500° C., the solid-solution does not develop. At a temperature higher than 1000° C., evaporation of the indium oxide proceeds to deteriorate the quality of the film and the resistance decreases. In the above temperature range, when the substrate temperature is higher, the crystallization of the indium oxide thin film tends to be more improved and the particle size thereof increases. The shape of the particle is spherical in the temperature range of 200–500° C., however, the shape of the particle change to cubic at a temperature higher than 500° C., reflecting the change of the crystal structure of the indium oxide. The substrate or a substrate holder may be rotated during the process.

During the low-voltage sputtering, partial pressure of the oxygen is preferably $1 \times 10^{-5}$–100 Pa. When the partial pressure of oxygen is lower than $1 \times 10^{-5}$ Pa, the oxygen content of the film is too low and the In metal is deposited. When the partial pressure of oxygen exceeds 100 Pa, the oxygen pressure is too high. The partial pressure of oxygen also influences the carrier density via the amount of oxygen demand in the film. Therefore, the partial pressure of oxygen must be set properly so as to reduce the resistance of the film. The partial pressure value depends on the sputtering device and the substrate temperature, however it is preferably $1 \times 10^{-3}$–1 Pa. During the low-voltage sputtering, in addition to the condition of the oxygen partial pressure, an effective generation of plasma must be taken into consideration. For that purpose, a mixture of Ar and $O_2$ is used, however Ar can be substituted by another rare gas. Total pressure of the mixture gas influences the flow of the sputter particle to change the quality of the film. When the mixture ratio of $O_2$/Ar is too high, plasma is not effectively generated. The sputtering voltage is preferably 540–330 v to reduce the resistance of the film. The target is the same as that of the pulsed laser deposition.

During the CVD process; salt of metal such as Sn or In is vaporized and introduced in the reaction chamber to be deposited on a substrate having an increased temperature. According to the method, a high quality ITO film may be produced at less cost by selecting the proper In material.

In the metal organic CVD method, in which an organo-metallic compound such as $In(CH_3)_3$ and $Sn(H_3)_4$ since the film can be deposited lattice by lattice on the substrate by controlling the timing of the introduction of the material gas to the chamber, a high quality ITO film can be obtained.

In the MBE method, which is one of the vapor deposition methods, vaporized material in a molecule beam collide with the surface of the substrate to be deposited in a super-vacuum chamber. For example, a high quality ITO thin film can be obtained according to the MBE method by In and Sn in each Knudsen cell being heated to be vaporized, $O_2$ gas being introduced to the chamber to the partial pressure of $1.2 \times 10^3$ Pa and reacted on the substrate. In the MBE method, the substrate temperature is preferably 700–1000° C. to the low resistance thin film.

Hereinafter, examples of the present invention are described.

EXAMPLE 1

In a super-vacuum chamber for laser abration (manufactured by ULVAC Japan Ltd.), YSZ single crystal substrate (001) face is inserted and heated to 200–800° C. by an IR lamp heater. In the chamber, oxygen gas is introduced at $1.2 \times 10^{-3}$ Pa, a KrF excimer laser (manufactured by Lambda Physics Ltd. Laser Device) is irradiated to a hyper-pure ITO target (manufactured by Toso Ltd., $SnO_2$ content:10 wt %), and an ITO is deposited to a substrate placed 30 cm away from the target. The thickness of the film is 200 nm.

A diffraction pattern of the sample was measured by an x-ray diffraction device (manufactured by Rigaku corporation Ltd., ATX-E) to find that the sample was a highly oriented and crystallized film. By the measurement of electric characteristics according to the van der Pauw method, when the substrate temperature increases, the mobility increases. When the temperature is 600° C., the mobility is at a maximum. The resistivity is $7.7 \times 10^{-5}$ Ωcm, the mobility is 42 cm/Vs and carrier density is $1.9 \times 10^{21}$, as shown in SAMPLES 1–4.

For comparison, ITO film are deposited in the same condition except that the substrate is silica glass. The lowest resistivity is $2 \times 10_{-2}$ Ωcm, as shown in SAMPLES 5–8. The conditions and result are shown in the following TABLE 1 and FIG. 1.

TABLE 1

|  | SUB-STRATE | SUBSTRATE TEMPERATURE (° C.) | CARRIER DENSITY (cm$^{-3}$) | MOBILITY (cm$^2$/Vs) | RESISTIVITY (Ω cm) |
|---|---|---|---|---|---|
| SAMPLE 1 | Y S Z | 200 | $2.7 \times 10^{21}$ | 7.8 | $2.9 \times 10^{-4}$ |
| SAMPLE 2 | Y S Z | 400 | $1.7 \times 10^{21}$ | 21 | $1.8 \times 10^{-4}$ |
| SAMPLE 3 | Y S Z | 600 | $1.9 \times 10^{21}$ | 42 | $7.7 \times 10^{-5}$ |
| SAMPLE 4 | Y S Z | 800 | $1.2 \times 10^{21}$ | 39 | $1.3 \times 10^{-4}$ |
| SAMPLE 5 | SILICA GLASS | 200 | $4.3 \times 10^{20}$ | 20 | $7.3 \times 10^{-4}$ |
| SAMPLE 6 | SILICA GLASS | 400 | $8.3 \times 10^{19}$ | 38 | $2.0 \times 10^{-3}$ |
| SAMPLE 7 | SILICA GLASS | 600 | $1.5 \times 10^{19}$ | 55 | $7.3 \times 10^{-3}$ |
| SAMPLE 8 | SILICA GLASS | 800 | $4.2 \times 10^{18}$ | 76 | $2.0 \times 10^{-2}$ |

EXAMPLE 2

ITO thin films are deposited under the same condition as EXAMPLE 1 except the Sn concentration in the target varies as shown in TABLE 2 and the substrate temperature is 600° C. in the YSZ single crystal substrates (SAMPLES 9–13) and the silica glass substrates (SAMPLES 14–17). The laser power density is 5 J/cm$^2$, and pulse frequency of the laser is 10 Hz. As the silica glass substrates, molten silica glass substrates (produced by Nippon Silica Glass Corporation Ltd.:Np) are used.

provided so that A–C, B–D are positioned diagonally. Without applying a magnetic field, electric current $I_{AB}$ is generated between the electrodes A–B and the voltage $V_{CD}$ between the electrodes C–D is measured. A Resistance $R_{AB,CD}$ is defined as followed.

$$R_{AB,CD} = V_{CD}/I_{AB}$$

Next, the current $I_{AC}$ is generated between the electrodes A–C and a magnetic field having a magnetic flux density B is applied perpendicularly to the sample face. When the voltage generated between the electrodes B–D at this time is expressed as $V_{BD}$, and $R_{AC,CD}$ is expressed as the following formula;

$$R_{AC,CD} = V_{BD}/I_{AC}$$

The resistivity ρ, carrier density n, carrier mobility μ is expressed as follows.

$$\mu = (\pi d/\ln 2).[(R_{AB,CD} + R_{BC,DA})/2].f(R_{AB,CD}/R_{BC,DA})$$

$$n = B/(e.d. R_{AC,BD})$$

$$\mu = (d/B).(R_{AC,BD}/\rho)$$

In the above formulas, e expresses an electrical charge of the electron and d expresses a depth of the epitaxial layer. F expresses coefficient for correcting an un-uniformity due to the shape of the epitaxial layer and sample and a position of the electrode, which have a relationship expressed by the following formula.

$$(R_{AB,CD} - R_{BC,DA})/(R_{AB,CD} + R_{BC,DA}) = (f/\ln 2).arccosh[\exp(\ln 2/f)/2]$$

The value of f can be obtained from the above formula, however the formula cannot be solved analytically. Therefore, in these EXAMPLES, tables previously calculated by a computer as a function $R_{AB,CD}/R_{BC,DA}(=R)$ and published ("Semiconductor Evaluation Technique", TABLE 3) is utilized.

The results are shown in TABLE 2.

TABLE 2

|  | SUBSTRATE | Sn CONCENTRATION IN TARGET (wt %) | Sn DENSITY IN FILM (mol %) | CARRIER DENSITY (cm$^{-3}$) | MOBILITY (cm$^2$/Vs) | RESISTIVITY (Ωcm) | Sn DENSITY IN FILM (NUMBER/cm$^3$) | ACTIVITY (%) |
|---|---|---|---|---|---|---|---|---|
| SAMPLE 9 | Y S Z | 0 | 0 | $1.5 \times 10^{19}$ | 55 | $7.6 \times 10^{-3}$ |  |  |
| SAMPLE 10 | Y S Z | 5 | 2.8 | $9.6 \times 10^{20}$ | 50 | $1.3 \times 10^{-4}$ | $0.86 \times 10^{21}$ | 110 |
| SAMPLE 11 | Y S Z | 10 | 5.3 | $1.9 \times 10^{21}$ | 42 | $7.7 \times 10^{-5}$ | $1.80 \times 10^{21}$ | 106 |
| SAMPLE 12 | Y S Z | 15 | 6.9 | $1.9 \times 10^{21}$ | 39 | $8.4 \times 10^{-5}$ | $2.20 \times 10^{21}$ | 86 |
| SAMPLE 13 | Y S Z | 20 | 10.5 | $2.1 \times 10^{21}$ | 30 | $1.5 \times 10^{-4}$ | $3.30 \times 10^{21}$ | 63 |
| SAMPLE 14 | SILICA GLASS | 0 | — | $3.6 \times 10^{18}$ | 42 | $4.1 \times 10^{-2}$ |  |  |
| SAMPLE 15 | SILICA GLASS | 5 | — | $3.6 \times 10^{20}$ | 1.8 | $9.7 \times 10^{-3}$ |  |  |
| SAMPLE 16 | SILICA GLASS | 10 | — | $3.4 \times 10^{21}$ | 0.1 | $1.8 \times 10^{-2}$ |  |  |
| SAMPLE 17 | SILICA GLASS | 15 | — | $2.1 \times 10^{21}$ | 0.5 | $6.5 \times 10^{-3}$ |  |  |

The Sn density (mol %), resistivity, mobility and carrier density were measured and found to be as shown in TABLE 2. The Sn density is measured by an X-ray fluorescence analysis. The resistivity and carrier density are measured by the van der Pauw method (Katouda et al., "Semiconductor Evaluation Technique", Sangyo-Tosho Ltd., 1994). The van der Pauw method is suitable for measurement of the Hall effect of thin film or thin piece semiconductor such as an epitaxial layer. For example, at each of the four corners of a 10 mm square ITO film, ohmic electrodes A, B, C, D are As is apparent from TABLE 2, Sn concentration in the film is properly in the range of 2.8–10.5 mol %.

As for the ITO films produced by the above process, Sn density in the film (number/cm$^3$), Sn dopant activity defined as carrier density (cm$^3$)/Sn density in the ITO film (number/cm$^3$) ×100 are also shown in TABLE 2. The Sn density is calculated from the Sn concentration measured by the XRF method.

The ITO film of the present invention is characterized to be heteroepitaxially grown in the YSZ single crystal structure. This is confirmed by an X-ray diffraction method and an image if of a transmittance electron microscope. Also, the ITO film of the present invention is characterized in that approximately 100% of Sn dopant added effectively generates the carrier. The reason that Sn dopant activity exceeds 100% apparently is that oxygen demand in the crystal contributes to the carrier density. Since the contribution of Sn and oxygen demand cannot be separated, Sn dopant activity is utilized for indicating the contribution of Sn and oxygen demand. As can be seen from TABLE 2, Sn dopant activity is preferably more than 80%, more preferably more than 100% (SAMPLES 10–12). When the Sn dopant activity is lower than 80%, the amount of Sn dopant which is not solid-dissolved increases and carrier electrons tend to be scattered to cause the reduction of the mobility (SAMPLE 13).

COMPARATIVE EXAMPLES 1

ITO film is produced on a silica glass substrate by a low-voltage sputtering method under the conditions of a sputtering voltage 330 V and a substrate temperature 300–800° C. However, a resistivity lower than $1 \times 10^{-4}$ Ωcm cannot be obtained.

Also, the ITO film is produced on the silica glass substrate by the direct-current sputtering method disclosed in Japanese Laid Open Patent Application No. 7-262829, under the conditions of an Ar—$O_2$ mixture gas pressure of $5 \times 10^{-3}$ Torr, a sputtering power of 320 W (direct current). However, it is not a clean process, and ITO is attached to the wall of the vacuum chamber. Also, since the oxygen pressure cannot be set in a low range, the oxygen demand cannot be efficiently introduced, and since the thickness of the film cannot be properly controlled, there is little possibility that atomic layer growth is realized.

EXAMPLE 3

ITO film is manufactured in the same manner as EXAMPLE 1 except that a glass substrate having a c-axis oriented ZnO layer is formed and is used as a substrate. The resistivity is $9 \times 10^{-5}$ Ωcm, mobility is 35 cm/Vs and the carrier density is 2.0

In the above process, a sputtering method is used to produce the c-axis oriented ZnO layer on the substrate. The substrate temperature is 350° C., $O_2$/Ar mixture ratio is 0.2 and total pressure is 4 mTorr. The produced layer is analyzed by an X-ray diffraction to observe that the C-axis is perpendicular to the substrate in the orientation.

EXAMPLE 4

ITO film is produced under the same condition as EXAMPLE 1 except that energy density of the laser beam is controlled and a distant between the target and the substrate is set 30 mm to provide for the atomic layer growth mode. The resistivity of the film is $7.5 \times 10^{-5}$ Ωcm, mobility is 45 cm/Vs, and carrier density is $1.8 \times 10^{21}$/cm$^3$. The morphology of the surface of the film during growth is observed by an interatomic microscope to confirm the atomic layer growth. On the entire surface of the obtained film, crystallization is improved and uniform thickness of the film is realized.

EXAMPLE 5

ITO film having a corundum crystal structure is produced on a sapphire substrate. As a result, it is confirmed that a low-resistance ITO thin film having a resistivity of $1 \times 10^{-4}$ Ωcm is obtained.

EXAMPLE 6

ITO thin films are manufactured by each of low-voltage sputtering, oxygen cluster beam deposition, chemical vapor deposition, metal organic chemical vapor deposition, metal organic chemical vapor deposition—atomic layer deposition, and molecule beam epitaxy. As a result, it is confirmed that a low-resistance ITO thin film having a resistivity of $1 \times 10^{-4}$ Ωcm is obtained. By CVD methods, except for the MBE method, large scale film production is realized.

EXAMPLE 7

ITO film is manufactured by the low-voltage sputtering method under the condition of a substrate temperature of 300–800° C. in the YSZ single crystal substrate (SAMPLES 18–20), and the silica glass substrate (SAMPLES 21–23). During production, the $O_2$/Ar mixture ratio is 0.2 and total pressure is 4 mtorr. The resistivity of the ITO films is shown in TABLE 3.

TABLE 3

| | SUBSTRATE | SUBSTRATE TEMPERATURE (° C.) | RESISTIVITY (Ω cm) |
|---|---|---|---|
| SAMPLE 18 | Y S Z | 300 | $2.1 \times 10^{-4}$ |
| SAMPLE 19 | Y S Z | 600 | $9.4 \times 10^{-5}$ |
| SAMPLE 20 | Y S Z | 800 | $8.8 \times 10^{-5}$ |
| SAMPLE 21 | SILICA GLASS | 300 | $1.9 \times 10^{-4}$ |
| SAMPLE 22 | SILICA GLASS | 600 | $2.1 \times 10^{-3}$ |
| SAMPLE 23 | SILICA GLASS | 800 | $2.4 \times 10^{-3}$ |

On the substrate having a temperature of 300–800° C., ITO films having a resistivity lower than $1 \times 10^{-4}$ Ωcm are obtained.

Next, the usage of the substrate is described.

The YSZ single crystal substrate and sapphire substrate are suitable for a projection-type LCD, a compact high-resolution LCD, and an organic EL display for special usage.

The glass substrate on which a crystal layer having a c-axis orientation is formed is suitable for a LCD, a plasma display, an organic EL display and the like.

The silicon single crystal substrate has advantages in that it can be developed in a wide range and a large size of substrate can be obtained, compared to other substrates. Thus, it is suitable for use as a substrate having an electrode such as a light emitting device, a substrate having an electrode for oxide laser and the like.

According to the present invention, a low-resistance ITO thin film having a resistivity lower than $1 \times 10^{-4}$ Ωcm is provided. The pulsed laser vapor deposition method has advantages in that it is clean, oxygen pressure can be set high and the thickness of the film can be properly controlled. Therefore, by using the method, a low-resistance ITO thin film excellent in resistance, mobility, and carrier density, having an improved crystal structure and uniform-thickness can be provided.

By using low-voltage sputtering, oxygen cluster beam deposition, chemical vapor deposition, metal organic chemical vapor deposition, metal organic chemical vapor deposition—atomic layer deposition or molecule beam epitaxy, the ITO thin film can be produced in a large scale at lower cost.

The present invention is not limited to these embodiments, but various variations and modifications may be made without departing from the scope of the present invention. For example, the condition of ITO thin film production such as composition of the target, kind and temperature of the substrate, vacuum degree, distance between the target and substrate, laser beam can be varied or modified. Also, the transparent electrode obtained can be made a desired patterning.

What is claimed is:

1. A low resistance ITO thin film having a resistivity less than $1 \times 10^{-4}$ Ωcm, said film deposited on a single crystalline substrate having a crystal face selected from the group consisting of a YSZ single crystal (100) face, a YSZ single crystal (111) face, a 3C-SiC single crystal (100) face, a $CaF_2$ single crystal (100) face, a MgO single crystal (100) face, a 6H-SiC single crystal (0001) face and a ZnO (0001) face.

2. A low resistance ITO thin film according to claim 1, wherein Sn dopant activity defined as {carrier density ($cm^{-3}$)/Sn density in said ITO film (number of $Sn/cm^3$)} is greater than about 80%.

3. A low resistance ITO thin film according to claim 1, wherein film mobility is greater than 39 $cm^2$/Vs.

4. A low resistance ITO thin film according to claim 1, wherein said ITO thin film has a pattern formed thereon.

5. A low resistance ITO thin film according to claim 1, wherein said ITO thin film has a $In_2O_3$ crystal structure of one of a C-rare earth type and a corundum type.

6. A low resistance ITO thin film according to claim 1, wherein said ITO thin film is formed on said substrate which has a temperature between about 500 and about 1000° C. by a pulsed laser deposition method.

7. A low resistance ITO thin film according to claim 1, wherein said ITO thin film is formed by one of a low-voltage sputtering, an oxygen cluster beam deposition, a chemical vapor deposition, a metal organic chemical vapor deposition—atomic layer deposition, and a molecule beam epitaxy.

8. A low resistance ITO thin film having a resistivity less than about $1 \times 10^{-4}$ Ωcm deposited on a c-axis-oriented ZnO film provided on a crystalline substrate, said low resistance ITO thin film being deposited by epitaxial growth.

9. A low resistance ITO thin film according to claim 8, wherein Sn dopant activity defined as {carrier density ($cm^{-3}$)/Sn density in said ITO film (number of $Sn/cm^3$)} is greater than about 80%.

10. A low resistance ITO thin film according to claim 8, wherein mobility of said ITO thin film is greater than about 39 $cm^2$/Vs.

11. A low resistance ITO thin film according to claim 8, wherein said crystalline substrate is provided to accept said c-axis-oriented ZnO film crystal structure deposited thereon.

12. A low resistance ITO thin film according to claim 8, wherein said single crystalline substrate is one of a YSZ single crystal substrate, a substrate on which a c-axis oriented ZnO thin film is formed, a sapphire substrate, a SiC single crystal substrate and a silicon single crystal substrate.

13. A low resistance ITO thin film having a resistivity less than about $1 \times 10^{-4}$ Ωcm deposited on a c-axis oriented ZnO film provided on a glass substrate, said low resistance ITO thin film being deposited by epitaxial growth.

* * * * *